United States Patent
Joseph

(10) Patent No.: US 8,022,851 B2
(45) Date of Patent: Sep. 20, 2011

(54) DAC WITH DATA INDEPENDENT COMMON MODE DYNAMICS

(75) Inventor: Briaire Joseph, Mol (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/665,809

(22) PCT Filed: Jun. 5, 2008

(86) PCT No.: PCT/IB2008/052545
§ 371 (c)(1),
(2), (4) Date: Dec. 21, 2009

(87) PCT Pub. No.: WO2009/001308
PCT Pub. Date: Dec. 31, 2008

(65) Prior Publication Data
US 2010/0176978 A1  Jul. 15, 2010

(30) Foreign Application Priority Data
Jun. 27, 2007 (EP) ..................... 07111124

(51) Int. Cl.
*H03M 1/66* (2006.01)
(52) U.S. Cl. ...................... 341/144; 341/145

(58) Field of Classification Search .................. 341/144, 341/145, 150, 154, 122
See application file for complete search history.

(56) References Cited

U.S. PATENT DOCUMENTS

| 5,818,372 | A | 10/1998 | Noro |
| 7,535,396 | B1 * | 5/2009 | Melanson ...................... 341/144 |
| 2003/0048136 | A1 * | 3/2003 | Palaskas et al. ............... 330/258 |
| 2006/0192703 | A1 | 8/2006 | Yen |

FOREIGN PATENT DOCUMENTS

| EP | 1139571 A1 | 10/2001 |
| WO | 02/27940 A2 | 4/2002 |
| WO | 2005/002058 A1 | 1/2005 |

* cited by examiner

Primary Examiner — Joseph Lauture

(57) ABSTRACT

A current-steered DAC has first and second differential outputs for providing an analog output signal under control of a digital input signal. In operational use of the DAC, the output signal has a differential component, which is representative of the digital input signal, and also has a first common-mode component. The DAC has circuitry operative to add an extra common-mode component to both the first and second differential outputs so as to make a sum of the first common-mode component and the extra common-mode component substantially independent of a state change of the digital input signal.

3 Claims, 4 Drawing Sheets

Fig.1

(102) $\Delta V(X) = [R_0+\delta R] \cdot I_{POS}(X) - [R_0-\delta R] \cdot I_{NEG}(X)$ (104) $\Delta V(X) = R_0 \cdot [I_{POS}(X) - I_{NEG}(X)] + \delta R \cdot [I_{POS}(X) + I_{NEG}(X)]$ (106) $CMRR = -10 \cdot {}^{10}\log[(\delta R)^2 / (R_0)^2]$ (108) $Z(Y) = \frac{1}{2} \cdot [I_{POS}(Y) + I_{NEG}(Y)]$ (110) $I_{out\,POS}(X,Y) = I_{POS}(X) + \frac{1}{2} \cdot [I_{POS}(Y) + I_{NEG}(Y)]$ (112) $I_{out\,NEG}(X,Y) = I_{NEG}(X) + \frac{1}{2} \cdot [I_{POS}(Y) + I_{NEG}(Y)]$

DAC WITH DATA INDEPENDENT COMMON MODE DYNAMICS

FIELD OF THE INVENTION

The invention relates to an electronic circuit with a digital-to-analog converter (DAC).

BACKGROUND ART

DACs are well known in the art of electronic circuitry. A DAC converts digital input data into an analog output signal. A typical field of application is the processing of audio. Audio data is processed in the digital domain, e.g., as a piece of music stored on a DVD or downloaded from the Internet, but the result needs to be translated to an analog signal in order for a human being to consume it.

A characteristic of a DAC that co-determines its performance is referred to as "linearity". The linearity of a DAC represents the property that for each change in the digital input data the analog output shows a proportionate change.

A typical configuration of a DAC comprises multiple current sources that are selectively switched to an output under control of the digital input. The currents are added at the output, and the value of the summed currents is representative of the digital data at the input.

A current-mode DAC preferably generates a differential current output for producing a differential voltage. In an electrically noisy environment, the noise voltage is usually a component common to both outputs and gets cancelled by taking the difference between the outputs. However, the differential output voltage may contain a contribution that is not proportional to the differential currents. This contribution is commonly referred to as the "common-mode" signal. DACs are designed so as to keep this common-mode signal as small as possible.

SUMMARY OF THE INVENTION

The invention relates to an electronic circuit comprising a DAC with first and second differential outputs for providing an analog output signal under control of a digital input signal to the DAC. The invention is defined by the independent claim. Dependent claims describe advantageous embodiments.

In operational use of the DAC, the output signal comprises a differential output signal, which is representative of the digital input signal. The analog output signal also comprises a first common-mode signal. The DAC comprises circuitry operative to add an extra common-mode signal to both the first and second differential outputs so as to make a sum of the first common-mode signal and the extra common-mode signal substantially independent of a state change of the digital input signal.

As a result, the differential output signal can be identified more easily than in conventional DACs, as the common-mode contribution is independent of the actual digital input data to be converted. Such a signal-independent common-mode contribution is predictable, and can therefore be filtered out more easily than a signal-dependent common-mode contribution.

In an embodiment of the invention, the DAC is a current-steering DAC. The DAC comprises a first current source that is switched to either the first or the second differential output under control of the digital input signal. The circuitry for adding the extra common mode signal comprises a second current source and a third current source. The second current source is switched between two contacts, each connected to the first differential output, under control of a digital control signal. The third current source is likewise switched between two further contacts, each connected to the second differential output, under control of the digital control signal. The digital input signal and the digital control signal are samples on the same time basis. First and second subsequent samples of the digital control signal have different states if third and fourth subsequent samples of the digital input signal, coinciding in time with the first and second samples, respectively, have the same states. The first and second subsequent samples of the digital control signal have the same state if the third and fourth subsequent samples of the digital input signal, coinciding in time with the first and second samples, respectively, have different states. Accordingly, either the first current source is switched, or the second and third current sources are switched at each sampling instant. The overall common-mode signal then shows this switching at each instant, thus contributing to the periodic character that facilitates the filtering out. Preferably, the first current source comprises a fourth current source and a fifth current source, and the second, third, fourth and fifth current sources have an identical configuration, so as to have a practically ideal periodic character in the common-mode signal.

For completeness, reference is made to the following publications.

WO2005/002058, filed for the same inventor, relates to a DAC with a first current source to which a first digital signal is applied for conversion to an analog signal. The first digital signal has a predetermined clock cycle. The DAC further comprises a second dummy current source to which a second digital signal is applied. The dummy current source is not connected to any signal path in the DAC. The second digital signal is derived from the first digital signal so that in any one clock cycle either the first or the second current source switches. This arrangement has the advantage that the dynamic behavior of the voltage of the supply lines is not dependent on the signal, but depends only on the clock cycle. WO2005/002058 neither teaches nor suggests using the current source arrangement to provide a common-mode signal independent of the digital input data to be converted to an analog signal in accordance with the invention.

EP1139571 relates to a DAC that includes a pulse-width modulator and a class-D amplifier. The class-D amplifier includes a low-pass filter. A differential signal is available from two nodes on the amplifier. Common-mode compensation circuitry generates a compensation signal during periods where a pulse-width modulator signal is not being generated to maintain a common-mode average value of from the nodes, without affecting the differential signal. EP1139571 only targets the average common-mode signal. This means that momentary signal dependencies are allowed in the common-mode signal during a certain time period so long as this can be compensated for during a later time period, as a result of which the average common-mode signal becomes signal-independent. In the invention, however, the common-mode signal is kept independent of the digital input data at all moments. This not only applies to each individual data sample but especially to the clock moments at which the data sample may change states (i.e., during the presence or absence of a rising or falling edge). Also note that EP1139571B1 relates to a differential signal in a three-state (+2, 0 or −2). This causes the problem that EP113957 seeks to solve. Note that the "0" at mid-state can be attained in two ways: if outA=1 and outB=1 then outA−outB=0; however, also if outA=−1 and outB=−1, then outA−outB=0. Differentially this leads to the same result but it has a major impact on the common-mode signal: outA+outB=+2 or −2 at mid-state, and 0 at the two other states. Hence EP1139571 needs the trick to solve this problem. In the invention, this problem does not occur because the invention relates to a two-state differential output: +2 or −2. Hence, intrinsically the invention does not have the problem in the average of the common-mode signal because it is the same for both states.

U.S. 2006/0192703 relates to a DAC system, including a common-mode adjustment module, a pre-processing module, a DAC circuit and an assignment module. The common-mode adjustment module determines a first value S according to a digital input D. The pre-processing module connects to the common-mode adjustment module for determining a number of positive units which are turned on (Pa) and number of negative units which are turned on (Na) according to the first value S and the digital input D. The DAC circuit includes M three-level switch elements, wherein each three-level switch element has a positive unit capable of supplying a unit of positive electricity and a negative unit capable of supplying a unit of negative electricity, the DAC circuit generates a corresponding analog output according to Pa and Na. The assignment module is connected to the pre-processing module and the DAC circuit for controlling the M three-level switch elements to supply positive or negative electricity in a predetermined order according to the first value S. U.S. 2006/0192703 uses three-state switch elements within the context of dynamic element matching. U.S. 2006/0192703 does not focus on a common-mode-related problem at all but uses the common-mode signal to solve the analog problem that the two ways to generate a differential mid-state "0" (as described under EP1139571 above) can lead to two different analog signals due to mismatch between the devices within a three-state element.

BRIEF DESCRIPTION OF THE DRAWING

The invention is explained in further detail, by way of example and with reference to the accompanying drawing, wherein:

FIG. 1 is a list of mathematical expressions illustrating aspects of the invention;

Throughout the Figures, similar or corresponding features are indicated by same reference numerals.

DETAILED EMBODIMENTS

Figure 2:
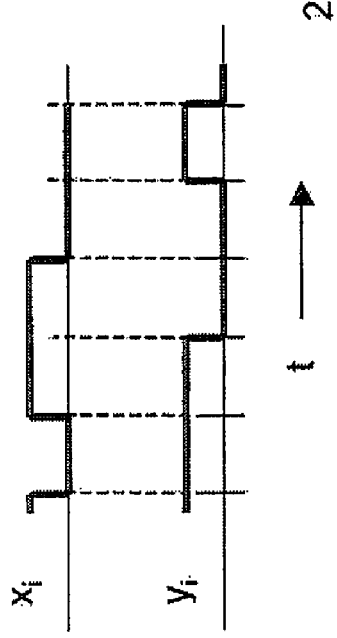
FIG. 2 is a diagram illustrating the interdependence between the digital input signal and the digital control signal.

Achieving sufficient linearity is one of the main requirements for digital-to-analog converters (DACs). One type of non-linearity originates from signals that couple into the DAC's sensitive circuitry and that thereby affect the desired signal. Differential signaling is a commonly used method to reduce this type of influence. The output signal is then defined as the difference between the signals at two individual outputs. This has the advantage that any distortion that couples simultaneously into both outputs cancels out in the differential output signal that results from a subtraction of the two original output signals.

The subtraction in hardware may introduce non-idealities. Consider the following example. Assume that the DAC has an input code X and two current outputs $I_{POS}(X)$ and $I_{NEG}(X)$ depending on code X. The currents are converted to voltages $V_{POS}(X)$ and $V_{NEG}(X)$ via two resistances in order to determine the differential signal. Now assume that the resistances are not identical, e.g., one has a resistance value of $R_0+\delta R$ and the other has the value $R_0-\delta R$. The differential voltage $\Delta V$ is then given by expression (102) in FIG. 1. Rewriting expression (102) results in expression (104).

In expression (104) the first part represents the differential signal, determined by the difference between $I_{POS}(X)$ and $I_{NEG}(X)$. The second part represents the common-mode signal and is determined by the sum of $I_{POS}(X)$ and $I_{NEG}(X)$. Accordingly, any non-linearity or other deviation that is present with the same magnitude in both the positive and the negative signal will cancel out in the differential part, but will still appear in the final differential signal $\Delta V(X)$ due to non-idealities.

The relative damping of the original common-mode signal is defined as the common-mode rejection ratio (CMRR) according to expression (106).

Achieving a sufficient CMRR in a high-speed DAC not only means that the quasi-static (X varies relatively slowly over time) CMRR is large enough but also that the dynamic CMRR is large enough. With regard to the dynamic CMRR, it is desirable during a transient, that changes in both the positive output and the negative output are equal at all moments. Even a small delay of one with respect to the other will degrade the dynamic CMRR, whereas the static CMRR may be acceptable. This will lead to a poor dynamic linearity of the output signal. In the following the focus will primarily be on the dynamic linearity because this generally limits the linearity at high-speed operations.

In practice the optimal magnitude of the CMRR that can be reached is restricted by both physical and practical factors. Hence, the amount of damping of the common-mode signal is limited. In order to reduce the common-mode influence further, the invention considers the common-mode signal itself.

In order to improve the linearity the inventor proposes to make the common-mode output signal independent of the input signal X. A manner of achieving this is by means of adding an extra signal Z(Y) to both outputs of the DAC so that the differential output remains unaffected. Extra signal Z depends on a digital input Y. Furthermore, the inventor proposes to mask the dependence on the digital input X by ensuring that the total common-mode switching activity at the output is such that the actual sources, input X or Y, have become indistinguishable. This means that the response of the extra signals Z in both outputs to an excitation must be identical to the common-mode response of the original outputs $I_{POS}$ and $I_{NEG}$. Extra signal Z(Y) then conforms to expression (108), and the modified outputs are given by expressions (110) and (112). Signal Y is now defined such that in combination with the original signal X the common-mode output signal becomes independent of X.

For example, note that the output signal of a high-speed DAC has a fixed number of, preferably equidistant, levels ($N_{tot}$) and is clocked with a sample time $T_S$. This means that the response to input signal X can only change a limited number of steps ($N_X$) and at discrete moments in time: $N_X(n \cdot T_S)$, with n=0, 1, 2, .... To make the total output independent of X it is sufficient that Y change at each clock sample by as many steps as X does not: $N_Y(n \cdot T_S)=N_{tot}-N_X(n \cdot T_S)$. The output will now experience a constant amount of common-mode switching ($N_{tot}$) at each clock moment. This is independent of the signal X.

The output of a DAC is, in general, a result of a combination of single-bit sub-circuits. In such a case the input signal X is a set of bits $x_i$ that represents the input word according to a certain coding scheme. For this situation the extra signal Y can also be represented by a set of bits, $y_i$. Each bit $y_i$ only depends on $x_i$ and in such a way that bit $y_i$ only changes state, at sample moments, when bit $x_i$ does not change state. Diagram 202 of FIG. 2 illustrates this interdependence between bits $x_i$ and $y_i$.

Figure 3:
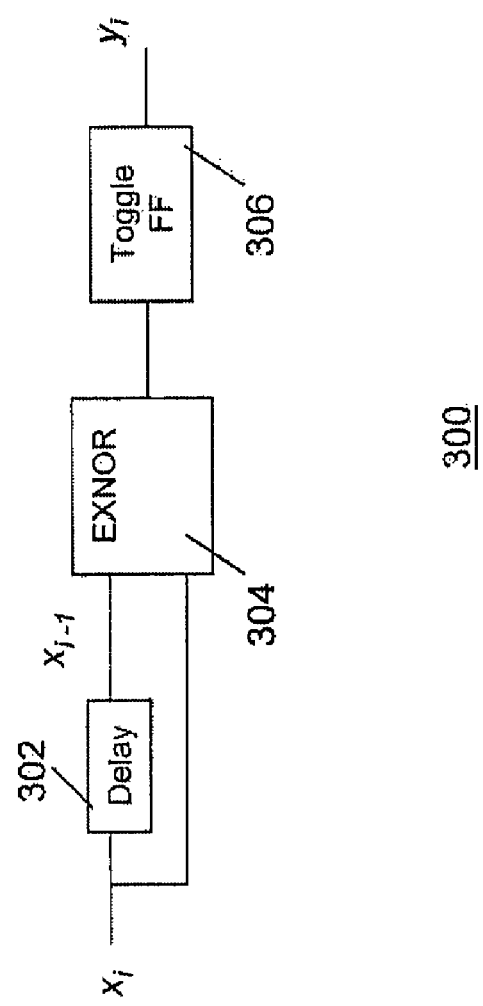
FIG. 3 is a diagram of an example circuit to generate the digital control signal.

FIG. 3 is a diagram of an example circuit 300 that creates bit $y_i$ under control of bit $x_i$. Circuit 300 comprises a one-clock-cycle delay component 302, an EXNOR gate 304 and a toggle flipflop 306. Component 302 comprises, e.g., a single-bit shift register. Gate 304 receives the current value of bit $x_i$ directly and the previous value of bit $x_i$ via delay component 302. The output of gate 304 is a logic high only if its inputs are the same, and a logic low if the inputs are different. If gate 304 produces a logic high, then this means that bit $x_i$ has not changed its value with regard to the previous sample. Upon receipt of a logic high, toggle flipflop 306 changes its state with respect to its previous state.

Figure 4:
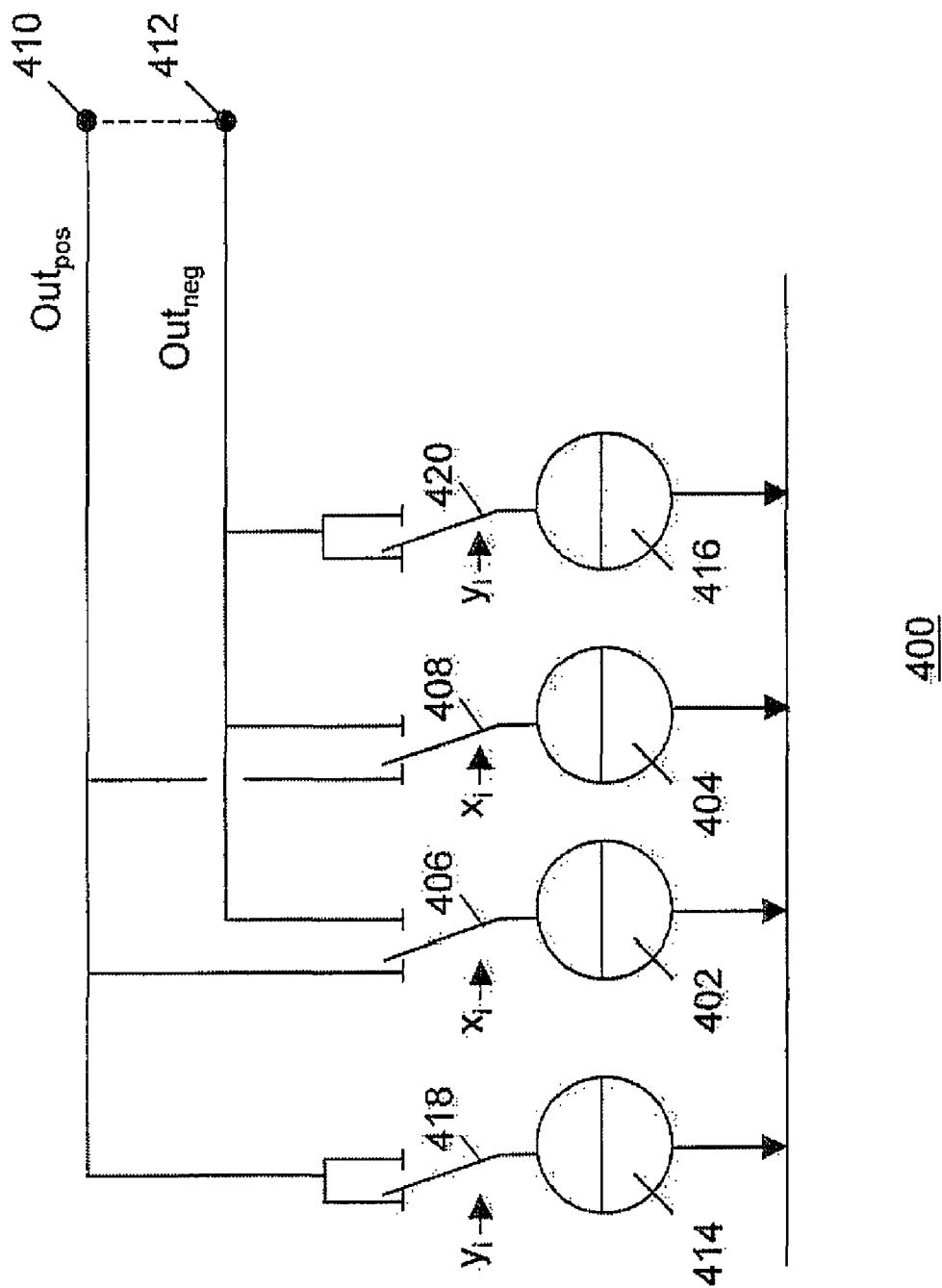
FIG. 4 is a diagram illustrating aspects of a DAC comprising single-bit sub-circuits.

FIG. 4 is a diagram of a single-bit sub-circuit 400. Circuit 400 comprises current sources 402 and 404 that are connected to switches 406 and 408, respectively. Switches 406 and 408 are controlled by the value of bit $x_i$ so as to connect both sources 402 and 404 to either output 410 or output 412. Outputs 410 and 412 together constitute the differential output for the contribution of bit $x_i$ to the differential output current representative of digital input signal X. Circuit 400 further comprises current sources 414 and 416. Current source 414 is connected to output 410 via a switch 418. Current source 420 is connected to output 412 via a switch 420. Switches 418 and 420 are controlled by bit $y_i$ of extra signal Y. Note that source 414 is connected to output 410 before and after the toggling of switch 418 under control of bit $y_i$, and that source 416 is connected to output 412 before and after the toggling of switch 420. Operation is explained as follows.

The invention considers the dynamic common-mode behavior of the differential output signal. The signal is based on currents with a differential (or: positive and negative) character. The common-mode portion of the output signal is equal to the sum of the positive and negative currents. The summation of the currents can be imagined by short-circuiting outputs 410 and 412, and measuring the combined current flowing between outputs 410 and 412. Note that in this situation current sources 414 and 416, whose connections are controlled by bit $y_i$, and current sources 402 and 404, whose connections are controlled by bit $x_i$, react identically because differential outputs 410 and 412 are now short-circuited. Also note that the situation before switching of sources 414 and 416, and the situation after switching sources 414 and 416 are identical. However, during the toggling of switches 418 and 420, glitches occur because in practice the switching of a current from one terminal to the other is never perfectly smooth. This is due to the configuration of switches 418 and 420, the way they are controlled, non-idealities, etc. Accordingly, a transition or glitch effect occurs, even in a short-circuited output-pair. The behavior of bit $y_i$ has been explained above, with reference to FIG. 2. Bit $y_i$ should switch values where consecutive samples of bit $x_i$ do not switch values. This means that the net switching behavior in the short-circuited output is either a result of a glitch resulting from sources 402 and 404 switching under control of bit xi or current sources 418 and 420 switching under control of bit $y_i$. Current sources 402, 404, 414 and 416 are identical, and switches 406, 408, 418 and 420 and their control circuitry (not shown) are identical. As a result, it has become impossible to distinguish the origin (bit $x_i$ or bit $y_i$) of the glitches in the common-mode signal. Now that the common mode output signal has become independent of the values of bit $x_i$ and bit $y_i$, and in fact has become predictable (even periodic), the common mode signal can be filtered out so as to improve linearity.

Figure 5:
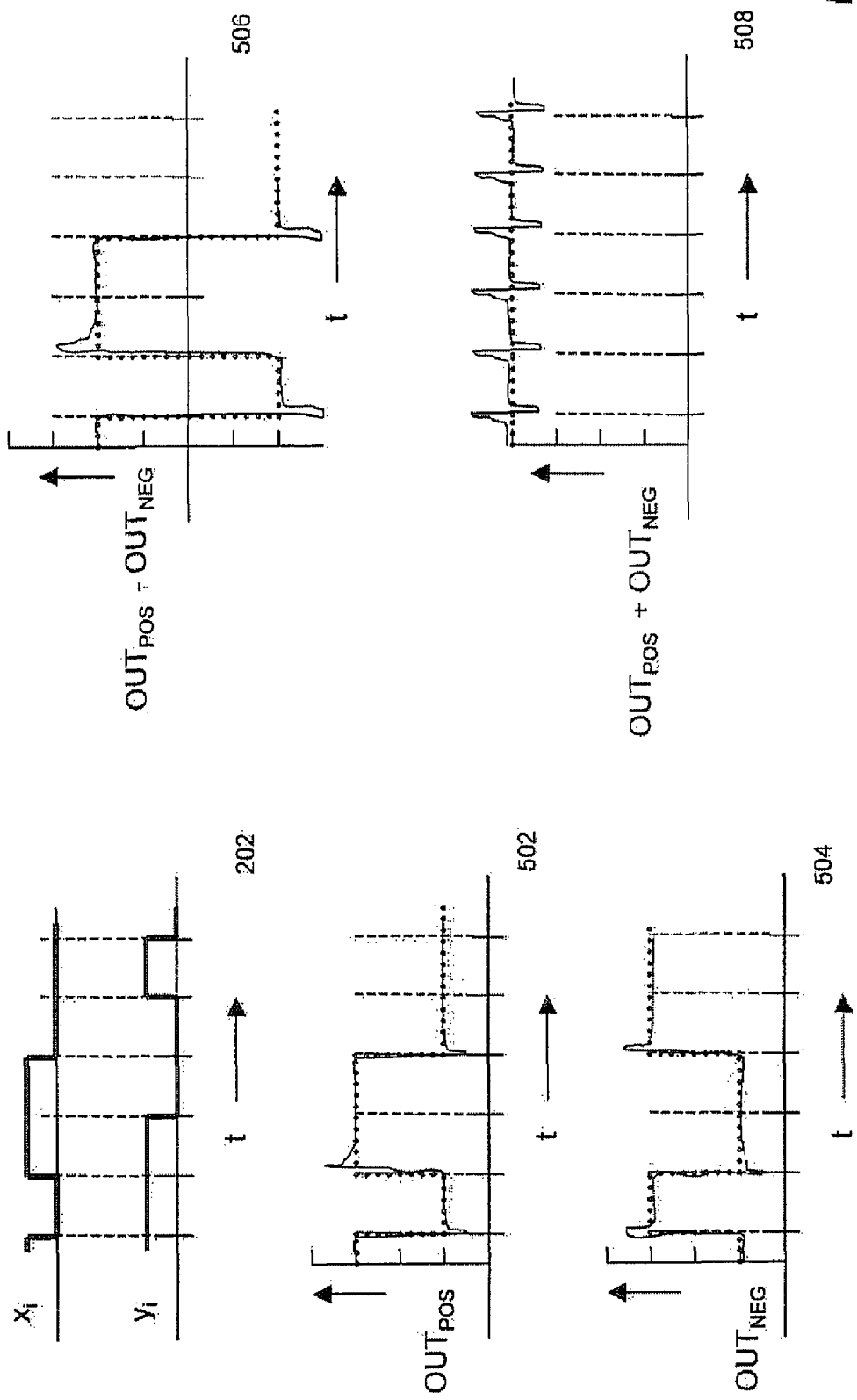
FIG. 5 shows time diagrams of various signals in the circuit of FIG. 4.

FIG. 5 comprises diagrams 202, 502, 504, 506 and 508 illustrating the interdependence of the various signals in circuit 400 of FIG. 4. Diagram 202 has been discussed above and represents the digital signals $x_i$ and $y_i$ as a function of time "t". Diagram 502 represents on the same time scale the analog output current $OUT_{POS}$ at node 410 of circuit 400. Diagram 504 represents the analog output current $OUT_{NEG}$ at node 412. Diagram 506 represents the analog differential output signal $OUT_{POS}$ minus $OUT_{NEG}$. Diagram 508 represents the analog common-mode signal $OUT_{POS}$ plus $OUT_{NEG}$. The analog output signals can assume one of a fixed number of levels as discussed above.

The invention claimed is:

1. An electronic circuit comprising a DAC with first and second differential outputs for providing an analog output signal under control of a digital input signal to the DAC, wherein:
    in operational use of the DAC, the output signal comprises a differential output signal, which is representative of the digital input signal, and also comprises a first common-mode signal;
    the DAC comprises circuitry operative to directly add an extra common-mode signal to both the first and second differential outputs so as to make a sum of the first common-mode signal and the extra common-mode signal substantially independent of a state change of the digital input signal.

2. The circuit of claim 1, wherein:
    the DAC is a current-steering DAC;
    the DAC comprises a first current source that is switched to either the first or the second differential output under control of the digital input signal
    the circuitry comprises:
    a second current source that is switched between two contacts, each connected to the first differential output under control of a digital control signal;
    a third current source that is switched between two further contacts, each connected to the second differential output under control of the digital control signal;
    the digital input signal and the digital control signal are samples on the same time basis;
    first and second subsequent samples of the digital control signal have different states if third and fourth subsequent samples of the digital input signal, coinciding in time with the first and second samples, respectively, have the same states;
    the first and second subsequent samples of the digital control signal have the same state if the third and fourth subsequent samples of the digital input signal, coinciding in time with the first and second samples, respectively, have different states.

3. The circuit of claim 2, wherein:
    the first current source comprises a fourth current source and a fifth current source; and
    the second, third, fourth and fifth current sources have an identical configuration.

* * * * *